(12) United States Patent
Hu et al.

(10) Patent No.: US 8,354,338 B2
(45) Date of Patent: Jan. 15, 2013

(54) CARRIER BOARD STRUCTURE WITH EMBEDDED SEMICONDUCTOR CHIP AND FABRICATION METHOD THEREOF

(75) Inventors: Chu-Chin Hu, Hsin-chu (TW); Shang-Wei Chen, Hsin-chu (TW)

(73) Assignee: Unimicron Technology Corp., Taoyuan (TW)

( * ) Notice: Subject to any disclaimer, the term of this patent is extended or adjusted under 35 U.S.C. 154(b) by 279 days.

(21) Appl. No.: 11/831,668

(22) Filed: Jul. 31, 2007

(65) Prior Publication Data
US 2008/0029895 A1 Feb. 7, 2008

(30) Foreign Application Priority Data
Aug. 2, 2006 (TW) .............................. 95128265 A

(51) Int. Cl.
*H01L 23/48* (2006.01)
*H01L 21/44* (2006.01)

(52) U.S. Cl. ............. 438/612; 257/762; 257/E21.476; 257/E23.01; 361/761

(58) Field of Classification Search ........... 257/762, 257/E23.01, E21.476; 361/761; 438/612
See application file for complete search history.

(56) References Cited

U.S. PATENT DOCUMENTS

| | | | | |
|---|---|---|---|---|
| 5,136,364 A * | 8/1992 | Byrne | ........................... | 257/751 |
| 5,593,927 A * | 1/1997 | Farnworth et al. | ........... | 438/113 |
| 6,555,906 B2 * | 4/2003 | Towle et al. | ................... | 257/723 |
| 2003/0011068 A1 * | 1/2003 | Song et al. | ................... | 257/723 |
| 2003/0205817 A1 * | 11/2003 | Romankiw | .................... | 257/758 |
| 2004/0160751 A1 * | 8/2004 | Inagaki et al. | ............... | 361/763 |
| 2005/0048759 A1 * | 3/2005 | Hsu | .............................. | 438/618 |
| 2005/0122698 A1 * | 6/2005 | Ho et al. | ....................... | 361/761 |

FOREIGN PATENT DOCUMENTS

JP 2001250902 A * 9/2001

OTHER PUBLICATIONS

English Machine Translation of JP 2001250902, obtained online Nov. 21, 2010.*

* cited by examiner

*Primary Examiner* — Peniel M Gumedzoe
(74) *Attorney, Agent, or Firm* — Sawyer Law Group, P.C.

(57) ABSTRACT

A circuit board structure with an embedded semiconductor chip and a fabrication method thereof are provided, including the steps of providing a semiconductor wafer having an active surface with a plurality of electrode pads, a connection metal layer formed on the electrode pads: forming a protective layer on the connection metal layer and the semiconductor wafer, performing a cutting process to form a plurality of semiconductor dies, providing a carrier board having at least one cavity for receiving the semiconductor chip; and forming sequentially on the protective layer covering the semiconductor chip and the carrier board a dielectric layer and a circuit layer electrically connected to the connection metal layer of the semiconductor chip. The present invention is a simple, in process and low in process cost, due to the connection metal layer covered by the protective layer formed on the semiconductor chip protected from oxidation and contamination.

7 Claims, 3 Drawing Sheets

CARRIER BOARD STRUCTURE WITH EMBEDDED SEMICONDUCTOR CHIP AND FABRICATION METHOD THEREOF

CROSS-REFERENCE TO RELATED APPLICATIONS

Under 35 U.S.C. 119, this application claims priority to Taiwan application no. 095128265 filed Aug. 2, 2006.

BACKGROUND OF THE INVENTION

1. Field of the Invention

The present invention relates to a circuit board structure with an embedded semiconductor chip and a fabrication method thereof, and more particularly, to a circuit board structure for embedding a semiconductor chip in a circuit board and a fabrication method thereof.

2. Description of the Prior Art

The structure of semiconductor packages and chips is becoming smaller in line with the trend towards high integration. In view of this, a circuit board functioning as a semiconductor chip circuit board (hereinafter referred to as a circuit board or carrier) is generally densely disposed with electrical connection pads in order to allow a semiconductor chip mounted on the circuit board to be electrically connected to the circuit board, thereby allowing the semiconductor chip to operate. To reduce package size, the area occupied by integrated circuits (IC) may be reduced by using high circuit density, multi-pin packages with a ball grid array (BGA) structure, flip chip structure, chip size packages (CSP), or multi-chip modules (MCM). However, before a semiconductor chip is mounted on a circuit board and packaging begins, a connection metal layer is formed on an exposed surface of the electrode pads for the semiconductor chip so as to provide for electrical connection elements, such as gold wires, bumps, and solder balls, for electrical connection with the circuit board, and also to prevent the electrode pads from extrinsically induced oxidation.

FIG. 1 is a schematic view showing how to form in a known manner a connection metal layer on the surfaces of electrode pads of a semiconductor chip. The prior art involves forming a passivation layer 13 on the surface of a semiconductor wafer 1 having undergone a required front-end process and formed with a plurality of electrode pads 12; forming a plurality of openings 130 in the passivation layer 13 to expose the electrode pads 12; electroplating a connection metal layer 14 onto the electrode pads 12 in the openings 130 using an electroplating process; performing a cutting process whereby the semiconductor wafer 1 is cut into a plurality of semiconductor dies, wherein a plurality of connection metal layers 14 are disposed on the electrode pads 12 of the semiconductor dies; and performing a packaging process on the semiconductor dies so as to finalize the outward electrical connection required for the semiconductor dies.

Although the aforesaid prior art enables a connection metal layer to be formed on the surfaces of the electrode pads so as to protect the electrode pads from oxidation and protect the electrode pads on the surface of the semiconductor chip against contamination during a subsequent packaging process performed on the semiconductor chip, electrical quality may be affected due to a surface of the connection metal layer being exposed to and therefore oxidized by air, because the connection metal layer is typically formed by copper electroplating.

Accordingly, a need exists for a solution that simplifies processing, reduces costs, and protects the electrode pads of a semiconductor chip from oxidation or contamination.

SUMMARY OF THE INVENTION

In light of the aforesaid drawbacks of the prior art, it is a primary objective of the present invention to provide a circuit board structure embedded with a semiconductor chip and a fabrication method thereof that protects the connection metal pads on the surface of the electrode pads of a semiconductor chip from oxidation and enhances process reliability and product quality.

Another objective of the present invention is to provide a circuit board structure embedded with a semiconductor chip and a fabrication method thereof that protects the connection metal pads on the surface of the electrode pads of a semiconductor chip from contamination during the chip embedding process.

In order to achieve the above and other objectives, the present invention provides a fabrication method for a circuit board structure with an embedded semiconductor chip. The fabrication method comprises the steps of: providing a semiconductor wafer having an active surface, the active surface having a plurality of electrode pads, wherein the electrode pads are formed with a plurality of connection metal pads thereon; forming a protection layer on the active surface of the semiconductor wafer and the exposed surface of the connection metal pads; cutting the semiconductor wafer and the protection layer to cut the semiconductor wafer into a plurality of semiconductor dies having the protection layer disposed thereon; providing a carrier board having at least one cavity, and receiving in the cavity at least one semiconductor chip having the protection layer; forming a dielectric layer on a surface of the carrier board and a surface of the protection layer; forming in the dielectric layer and the protection layer openings corresponding in position to the connection metal pads of the semiconductor chip to expose the connection metal pads; and forming a circuit layer on a surface of the dielectric layer, and forming conductive structures in the openings of the dielectric layer and the protection layer, such that the circuit layer is electrically connected to the connection metal pads of the semiconductor chip via the conductive structures.

In the method above, a passivation layer is formed on the active surface of the semiconductor chip and surfaces of the electrode pads and formed with openings to expose the electrode pads such that the connection metal pads is formed on the electrode pads.

With the fabrication method, the present invention further provides a circuit board structure having an embedded semiconductor chip, comprising: a carrier board having at least one cavity; a semiconductor chip received in the cavity of the carrier board and having an active surface, the active surface having a plurality of electrode pads, and having a passivation layer disposed on the active surface with openings to expose the electrode pads, wherein a gap is formed between the semiconductor chip and the cavity; a plurality of connection metal pads correspondingly disposed on the exposed electrode pads and a partial surface of the passivation layer around the openings; a protection layer only disposed on the connection metal pads and the passivation layer disposed on the active surface of the semiconductor chip to protect the connection metal pads on the semiconductor chip; a dielectric layer disposed on the carrier board and the protection layer, wherein a part of the dielectric layer fills the gap between the semiconductor chip and the cavity, and wherein a plurality of vias are disposed through the dielectric layer and the protection layer and correspondingly expose the connection metal pads; a dielectric layer disposed on the carrier board and the protection layer; and a circuit layer disposed on the dielectric layer and having extensions formed in vias disposed through the dielectric layer and the protection layer so as for the circuit layer to electrically connect to the connection metal pads of the semiconductor chip.

In the above-described structure, the carrier board is a circuit board, an insulating board, or a metal board. Also, the protection layer is made of polyimide (PI), epoxy, or benzocyclobutene (BCB).

A fabrication method of a semiconductor chip-embedded carrier board structure of the present invention further comprises the steps of forming a circuit build up structure on a dielectric layer and a circuit layer, wherein the circuit build up structure comprises at least one dielectric layer, a circuit layer stacked on the dielectric layer, and conductive structures formed in the dielectric layer; forming a plurality of electrical connection pads on an outer surface of the circuit build up structure; forming a solder mask on the outer surface of the circuit build up structure; and forming a plurality of openings in the solder mask to expose the electrical connection pads.

A fabrication method of a semiconductor chip-embedded circuit board structure of the present invention further comprises the steps of: forming a protection layer on a surface of a semiconductor wafer before a cutting process is performed on the semiconductor wafer, such that the protection layer covers and thereby protects a connection metal pads disposed on the semiconductor wafer; performing a cutting process to form a plurality of semiconductor dies; and packaging the semiconductor dies to form the required semiconductor chip-embedded carrier board structure, the steps being conducted with a view to simplifying the process, reducing the process cost, protecting the connection metal pads on the semiconductor dies from oxidation, and protecting surfaces of electrode pads from contamination.

DETAILED DESCRIPTION OF THE PREFERRED EMBODIMENTS

The following specific embodiments are provided to illustrate the present invention. Others ordinarily skilled in the art can readily gain an insight into other advantages and features of the present invention based on the contents disclosed in this specification.

FIGS. 2A to 2G are cross-sectional views showing a preferred embodiment of a fabrication method of a circuit board structure with an embedded semiconductor chip of the present invention.

Figure 1:
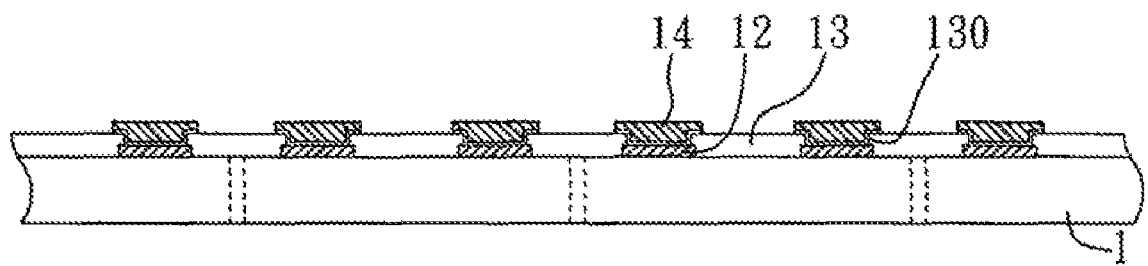
FIG. 1 (PRIOR ART) is a cross-sectional view of a circuit board structure for an integrated circuit chip showing how to form in a known manner a connection metal pads on the electrode pads of the circuit board structure by an electroplating process.
Figure 2A:
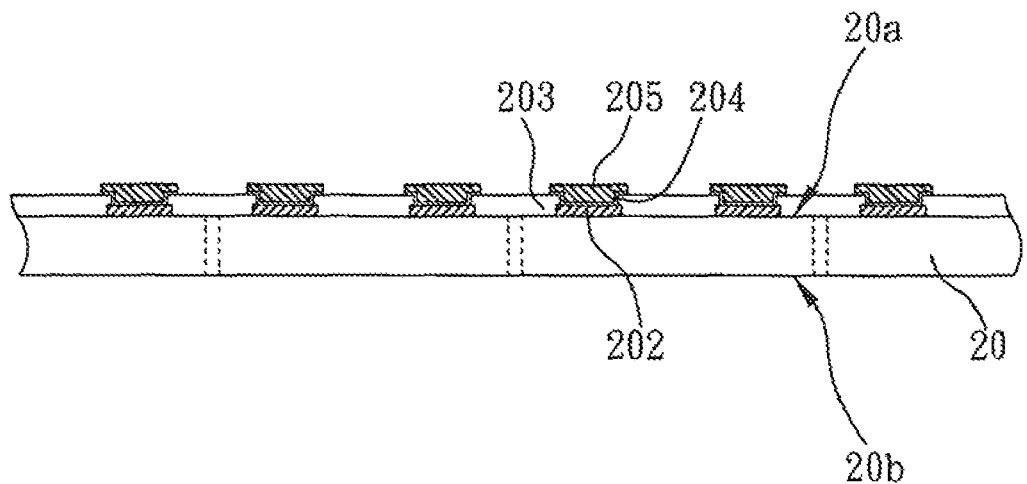
FIGS. 2A to 2G are cross-sectional views showing a fabrication method of a circuit board structure with an embedded semiconductor chip of the present invention.

As shown in FIG. 2A, the fabrication method comprises the steps of: providing a semiconductor wafer 20 having an active surface 20a and a non-active surface 20b, wherein the active surface 20a is opposite the non-active surface 20b and disposed with a plurality of electrode pads 202; forming a passivation layer 203 on the active surface 20a of the semiconductor wafer 20; forming openings 204 in the exposed surface of the passivation layer 203 to expose the electrode pads 202 of the semiconductor wafer 20; and forming a connection metal pad 205 made of copper on the electrode pads 202 of the semiconductor wafer 20. Although the process for forming the connection metal pad 205 involves complicated technologies, the process technologies are well known to semiconductor manufacturers. Such process technologies are not technical features of the present invention and therefore are not described herein.

Figure 2B:
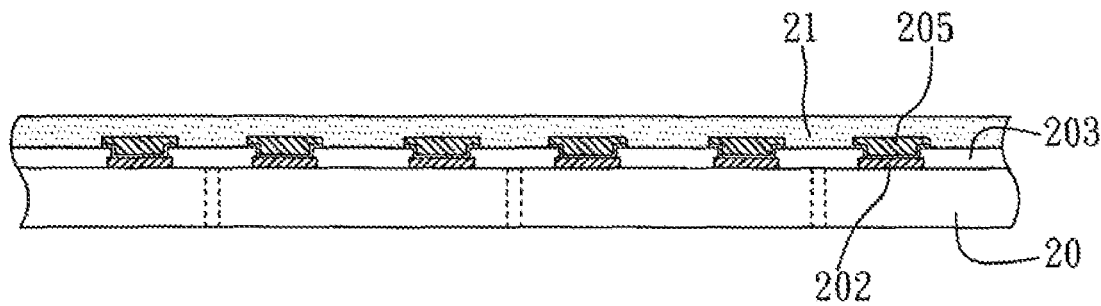

As shown in FIG. 2B, the fabrication method comprises the step of forming a protection layer 21 on the active surface of the semiconductor wafer 20 by printing or coating, wherein the connection metal pad 205 is covered and thereby protected by the protection layer 21; as a result, the connection metal pad 205 is prevented from oxidation, and surfaces of the connection metal pad 205 are free of contamination. The protection layer 21 is made of polyimide (PI), epoxy, or Benzocyclobutene (BCB).

As mentioned above, the protection layer 21 is formed on the active surface 20a of the semiconductor wafer 20 by printing or coating so as to effectively protect the connection metal pad 205 on the semiconductor wafer 20, simplifying the process, and reducing the process cost.

Figure 2C:
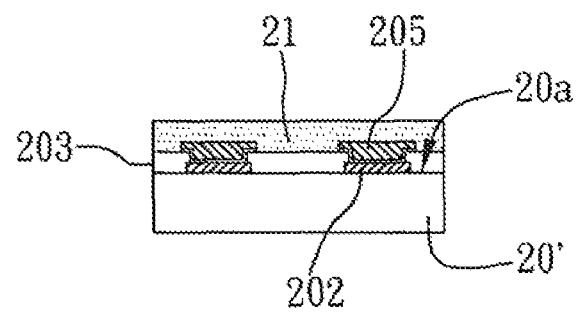

As shown in FIG. 2C, the fabrication method comprises the step of performing a dicing saw process whereby the semiconductor wafer 20 is cut into a plurality of semiconductor dies 20', wherein a plurality of connection metal pads 205 are disposed on the active surfaces 20a of the semiconductor dies 20', and the active surfaces 20a are covered with a protection layer 21. The semiconductor dies 20' are active or passive dies, such as capacitor chips, memory chips, Application Specific Integrated Circuit (ASIC) chips, and microprocessor chips.

Figure 2D:
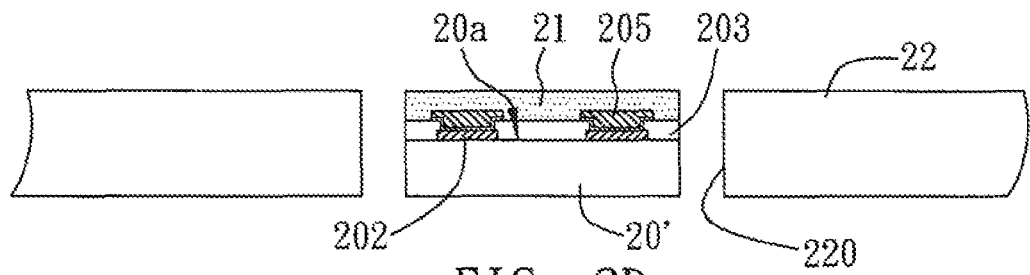

As shown in FIG. 2D, the fabrication method comprises the steps of providing a carrier board 22, the carrier board 22 being a circuit board formed with a circuit, an insulating board, or a metal board, and the carrier board 22 being formed with at least one cavity 220, wherein at least one semiconductor chip 20' is disposed.

Figure 2E:
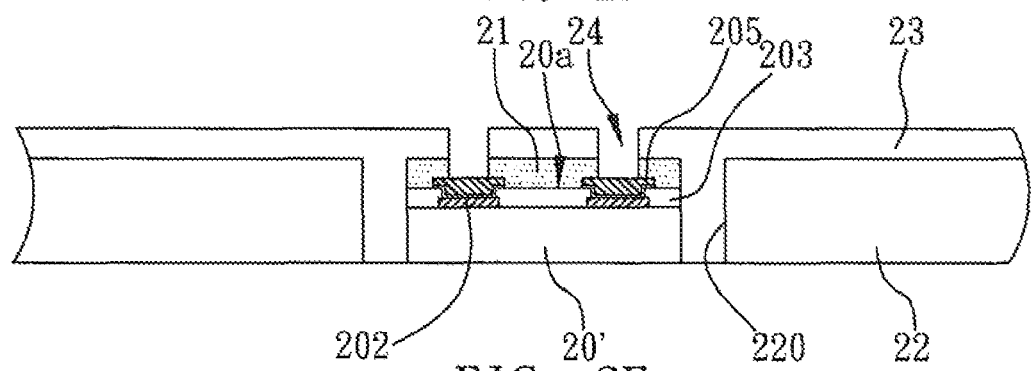

As shown in FIG. 2E, a dielectric layer 23 is formed on a surface of the carrier board 22 and a surface of the protection layer 21 on the semiconductor chip 20', and a plurality of vias 24 corresponding in position to the connection metal pads 205 on the semiconductor chip 20' are formed in the dielectric layer 23 and the protection layer 21 by laser ablation to expose upper surfaces of the connection metal pads 205. In this embodiment, the dielectric layer 23 is formed on the surface of the carrier board 22 and the surface of the protection layer 21 by one of attaching gluing or coating. The dielectric layer 23 is made of an insulating material, such as FR-4 resin, FR-5 resin, epoxy, polyester, cyanate ester, polyimide, Bismaleimide Triazine (BT), mixed epoxy, or glass fiber. A gap between the carrier board 22 and the semiconductor chip 20' in the cavity 220 of the carrier board 22 is filled with the dielectric layer 23, such that the dielectric layer 23 secures in position the semiconductor chip 20'. As shown in another embodiment, the gap between the carrier board 22 and the semiconductor chip 20' in the cavity 220 of the carrier board 22 is filled with an adhesive material, then the dielectric layer is formed on the surface of the carrier board embedded with the semiconductor chip, and eventually a circuit process (not shown) is performed.

Figure 2F:
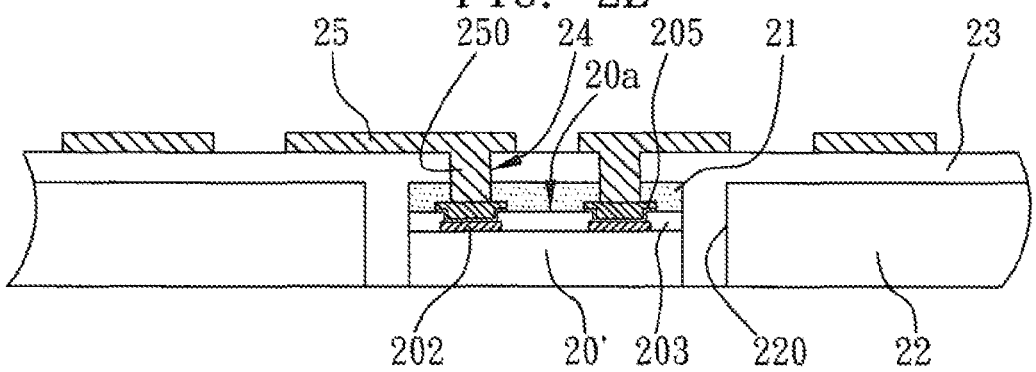

As shown in FIG. 2F, the fabrication method comprises the steps of forming a circuit layer 25 on the dielectric layer 23, forming conductive structures 250 in the vias 24 of the dielectric layer 23 and the protection layer 21, such that the circuit layer 25 is electrically connected to the connection metal pads 205 on the semiconductor chip 20' via the conductive structures 250. The process technologies for forming the circuit layer 25 on the dielectric layer 23 are numerous and complex, but such technologies are well known to semiconductor manufacturers. In that such process technologies are not technical features of the present invention, they are not described herein.

Figure 2G:
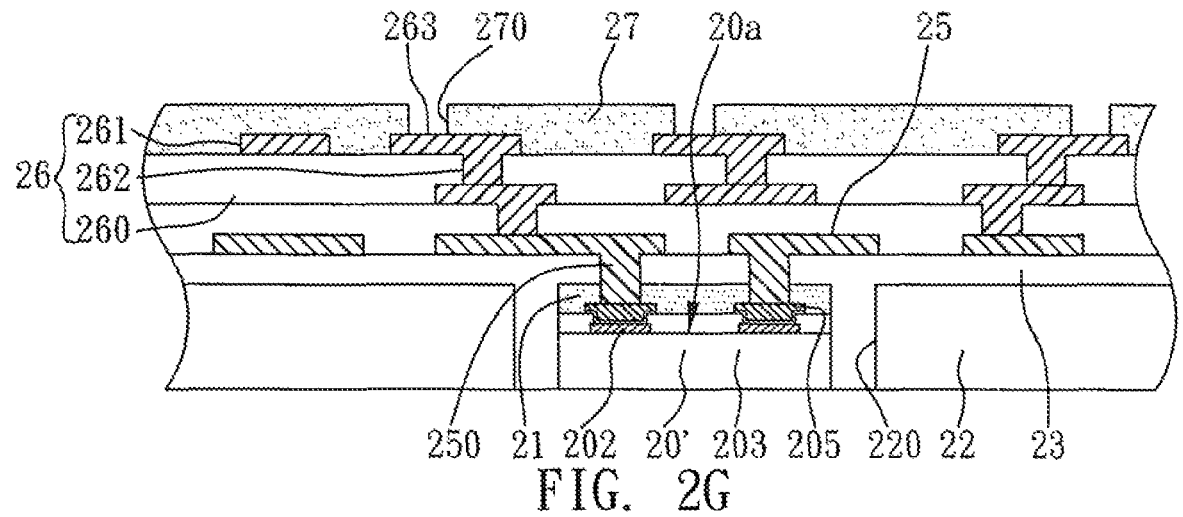

As shown in FIG. 2G, the fabrication method comprises the step of performing a circuit build up process on the dielectric layer 23 and the circuit layer 25 so as to form a circuit build up structure 26, and electrically connecting the circuit build up structure 26 to the circuit layer 25. The process technologies for forming the circuit build up structure 26 are numerous and complex, but the process technologies are well known to semiconductor manufacturers. Again, such process technologies are not technical features of the present invention and therefore are not described herein.

The circuit build up structure 26 comprises a dielectric layer 260, a patterned circuit layer 261 stacked on the dielectric layer 260, and a plurality of conductive structures 262 formed in the dielectric layer 260 to electrically connect to the circuit layer 261. The conductive structures 262 are electrically connected to the circuit layer 25. A plurality of electrical connection pads 263 are formed on the circuit layer 261, which is the outer layer of the circuit build up structure 26.

Referring to FIG. 2G, the circuit layer 261, which is the outer layer of the circuit build up structure 26, is covered with a solder mask 27 having a plurality of openings 270 for exposing a portion of the circuit layer 261 functioning as the electrical connection pads 263. A plurality of conductive elements (not shown), such as solder balls, conductive posts, or solder posts, are to be implanted on or connected to the electrical connection pads 263, to allow the semiconductor chip 20' received in the carrier board 22 to be electrically connected to an external electronic device via the electrode pads 202, the circuit layer 25, the circuit build up structure 26, and the conductive elements.

In the above, a semiconductor chip-embedded carrier board structure fabricated by the aforesaid process in accordance with the present invention comprises at least one semiconductor chip 20', protection layer 21, carrier board 22, dielectric layer 23, and circuit layer 25.

The semiconductor chip 20' comprises an active surface 20a and a non-active surface 20b opposite the active surface 20a, the active surface 20a having a plurality of electrode pads 202, and having a passivation layer 203 disposed on a surface of the active surface 20a of the semiconductor wafer 20, openings 204 formed on a surface of the passivation layer 203 to expose the electrode pads 202 of the semiconductor wafer 20, and a plurality of connection metal pads 205 made of copper and correspondingly disposed on the exposed electrode pads 202 of the semiconductor wafer 20 and a partial surface of the passivation layer 203 around the openings 204.

The carrier board 22 is a circuit board formed with a circuit, an insulating board, or a metal board and is penetrated by at least one cavity 220. The semiconductor chip 20' is received in the cavity 220.

The protection layer 21 is only disposed on the connection metal pads and the active surface 20a of the semiconductor chip 20' to protect the connection metal pads 205 underneath.

The dielectric layer 23 is disposed on a surface of the carrier board 22 and a surface of the protection layer 21. A plurality of vias 24 are disposed through the dielectric layer 23 and the protection layer 21 to correspondingly expose the connection metal pads 205 on the semiconductor chip 20'.

The circuit layer 25 is disposed on the dielectric layer 23 and electrically connected to the connection metal pads 205 on the semiconductor chip 20' via conductive structures (extensions) 250 formed in the vias 24 of the dielectric layer 23 and the protection layer 21.

The semiconductor chip-embedded circuit board structure of the present invention further comprises a circuit build up structure 26 formed on the dielectric layer 23 and the circuit layer 25 and electrically connected to the circuit layer 25.

The circuit build up structure 26 comprises a dielectric layer 260, a patterned circuit layer 261 stacked on the dielectric layer 260, and conductive structures 262 formed in the dielectric layer 260. The conductive structures 262 are electrically connected to the circuit layer 25. A plurality of electrical connection pads 263 are formed on the circuit layer 261, which is the outer layer of the circuit build up structure 26. The circuit layer 261, which is the outer layer of the circuit build up structure 26, is covered with a solder mask 27. The solder mask 27 comprises a plurality of openings 270 for exposing the electrical connection pads 263. A plurality of conductive elements (not shown), such as solder balls, conductive posts, or solder posts, are to be implanted on or connected with the electrical connection pads 263 to allow the semiconductor chip 20' received in the carrier board 22 to be electrically connected to an external electronic device via the electrode pads 202, the connection metal pad 205, the circuit layer 25, the circuit build up structure 26, and the conductive elements.

A fabrication method of a semiconductor chip-embedded circuit board structure of the present invention comprises the steps of forming a protection layer 21 on a surface of a semiconductor wafer 20 before the semiconductor wafer 20 is cut up so as to allow the protection layer 21 to cover and thereby protect a connection metal pad 205 underneath, performing a cutting process to form a plurality of semiconductor dies 20', embedding one of the semiconductor dies 20' in a cavity 220 of a carrier board 22, performing a circuit build up process on the carrier board 22 and the protection layer 21 above the semiconductor chip 20' so as to finalize outward electrical connection for the semiconductor chip. The present invention allows a protection layer to be formed on a surface of a semiconductor wafer, thus protecting the surface of the connection metal pad 205 from oxidation and contamination.

The aforesaid embodiments merely serve as the preferred embodiments of the present invention. They should not be construed as to limit the scope of the present invention. Hence, many changes can be made in the present invention. It will be apparent to those ordinarily skilled in the art that all equivalent modifications or changes made without departing from the spirit and the technical concepts disclosed by the present invention should fall within the scope of the appended claims.

What is claimed is:

1. A fabrication method of a circuit board structure with an embedded semiconductor chip, comprising the steps of:
   providing a semiconductor wafer having an active surface, the active surface having a plurality of electrode pads;
   forming a passivation layer on the active surface of the semiconductor chip and surfaces of the electrode pads and the passivation layer formed with openings to expose the electrode pads, followed by forming a plurality of connection metal pads on the electrode pads;
   forming a protection layer on the connection metal pads and the passivation layer formed on the active surface of the semiconductor wafer and a surface of the connection metal pads, wherein the protection layer completely covers the surface of the connection metal pads;

cutting the semiconductor wafer and the protection layer to cut the semiconductor wafer into a plurality of semiconductor dies having the protection layer disposed thereon;

providing a carrier board having at least one cavity, and receiving in the cavity at least one semiconductor chip having the protection layer, wherein a gap is formed between the semiconductor chip and the cavity;

forming a dielectric layer on the carrier board and the protection layer, wherein a part of the dielectric layer fills the gap between the semiconductor chip and the cavity;

simultaneously forming through the dielectric layer and the protection layer vias corresponding in position to the connection metal pads of the semiconductor chip by laser so as to expose the connection metal pads; and forming on the dielectric layer a circuit layer, that has conductive portions disposed in the vias of the dielectric layer and the protection layer, such that the circuit layer is electrically connected to the connection metal pads of the semiconductor chip via the conductive portions.

2. The fabrication method for a circuit board structure with an embedded semiconductor chip of claim 1, wherein the carrier board is one selected from the group consisting of a circuit board formed with a circuit, an insulating board, and a metal board.

3. The fabrication method for a circuit board structure with an embedded semiconductor chip of claim 1, wherein the connection metal pads are made of copper.

4. The fabrication method for a circuit board structure with an embedded semiconductor chip of claim 1, wherein the protection layer is made of one selected from the group consisting of polyimide (PI), epoxy, and Benzocyclobutene (BCB).

5. The fabrication method for a circuit board structure with an embedded semiconductor chip of claim 1, further comprising the step of forming on the dielectric layer and the circuit layer a circuit build up structure connecting electrically to the circuit layer and having an outer layer formed with a plurality of electrical connection pads.

6. The fabrication method for a circuit board structure with an embedded semiconductor chip of claim 5, further comprising the steps of forming a solder mask on the outer surface of the circuit build up structure, and forming in the solder mask a plurality of openings for exposing the electrical connection pads.

7. The fabrication method for a circuit board structure with an embedded semiconductor chip of claim 5, wherein the circuit build up structure comprises at least one dielectric layer, a circuit layer stacked on the dielectric layer, and conductive vias disposed in the dielectric layer.

* * * * *